(12) United States Patent
Nakashiba

(10) Patent No.: US 8,686,532 B2
(45) Date of Patent: Apr. 1, 2014

(54) SEMICONDUCTOR DEVICE HAVING AN ANNULAR GUARD RING

(75) Inventor: Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/175,367

(22) Filed: Jul. 1, 2011

(65) Prior Publication Data

US 2011/0260260 A1    Oct. 27, 2011

Related U.S. Application Data

(62) Division of application No. 12/426,985, filed on Apr. 21, 2009, which is a division of application No. 11/269,589, filed on Nov. 9, 2005, now Pat. No. 7,550,850.

(30) Foreign Application Priority Data

Nov. 16, 2004   (JP) ................................ 2004-332349

(51) Int. Cl.
  *H01L 29/02*   (2006.01)
(52) U.S. Cl.
  USPC .................................. 257/495; 257/E27.016
(58) Field of Classification Search
  USPC ....................................................... 257/495
  See application file for complete search history.

(56) References Cited

U.S. PATENT DOCUMENTS

| | | | |
|---|---|---|---|
| 5,970,346 A | 10/1999 | Liaw | |
| 6,355,537 B1 | 3/2002 | Seefeldt | |
| 6,429,502 B1 | 8/2002 | Librizzi et al. | |
| 6,465,283 B1 * | 10/2002 | Chang et al. | 438/135 |
| 6,479,869 B1 * | 11/2002 | Hiraga | 257/350 |
| 6,498,089 B2 | 12/2002 | Komada | |
| 6,638,850 B1 | 10/2003 | Inagawa et al. | |
| 6,831,346 B1 * | 12/2004 | Li et al. | 257/499 |
| 6,998,712 B2 * | 2/2006 | Okada et al. | 257/758 |
| 7,053,453 B2 | 5/2006 | Tsao et al. | |

(Continued)

FOREIGN PATENT DOCUMENTS

| | | |
|---|---|---|
| CN | 1519924 | 8/2004 |
| JP | 2001-085630 | 3/2001 |

(Continued)

OTHER PUBLICATIONS

Chinese Offical Action—200810144562.8—Aug. 24, 2010.

(Continued)

*Primary Examiner* — Matthew Landau
*Assistant Examiner* — Igwe U Anya
(74) *Attorney, Agent, or Firm* — Young & Thompson

(57) ABSTRACT

A semiconductor chip 100 includes a logic unit and an analog unit 153. Furthermore, the semiconductor chip 100 includes a silicon substrate 101; a first insulating film 123 to a sixth insulating film 143 formed on the silicon substrate 101; and an annular seal ring 105 consisting of a first conductive ring 125 to a sixth conductive ring 145 buried in the first insulating film 123 to the sixth insulating film 143, which surrounds the periphery of the logic unit and the analog unit 153. In the seal ring region 106, there is formed a pn junction acting as a nonconducting part 104, which blocks conduction in a path from the logic unit, through the seal ring 105 to the analog unit 153.

10 Claims, 13 Drawing Sheets

(56) References Cited

U.S. PATENT DOCUMENTS

| | | | |
|---|---|---|---|
| 7,193,296 B2 | 3/2007 | Fujita | |
| 7,205,637 B2 | 4/2007 | Koike | |
| 7,235,864 B2 | 6/2007 | Lee | |
| 2002/0125577 A1 | 9/2002 | Komada | |
| 2003/0071280 A1 | 4/2003 | Yu | |
| 2003/0193090 A1* | 10/2003 | Otani et al. | 257/758 |
| 2004/0042285 A1 | 3/2004 | Yoshizawa et al. | |
| 2004/0063291 A1 | 4/2004 | Williams et al. | |
| 2004/0150070 A1 | 8/2004 | Okada et al. | |
| 2004/0217477 A1 | 11/2004 | Tsai et al. | |
| 2005/0067722 A1 | 3/2005 | Koike | |
| 2005/0087878 A1 | 4/2005 | Uesugi et al. | |
| 2005/0110119 A1 | 5/2005 | Chen | |
| 2005/0127473 A1 | 6/2005 | Sakagami | |
| 2005/0151248 A1* | 7/2005 | Shau | 257/734 |
| 2005/0156207 A1* | 7/2005 | Yazawa et al. | 257/288 |
| 2005/0212071 A1 | 9/2005 | Yue et al. | |
| 2005/0239273 A1 | 10/2005 | Yang | |
| 2005/0275032 A1 | 12/2005 | Kodama et al. | |
| 2006/0012003 A1* | 1/2006 | Mallikarjunaswamy et al. | 257/501 |
| 2006/0125040 A1* | 6/2006 | Levin et al. | 257/471 |
| 2006/0206277 A1 | 9/2006 | Horch | |
| 2007/0164809 A1* | 7/2007 | Fukuda et al. | 327/539 |
| 2008/0061323 A1* | 3/2008 | Yazawa et al. | 257/253 |
| 2008/0061397 A1 | 3/2008 | Uchida | |

FOREIGN PATENT DOCUMENTS

| | | |
|---|---|---|
| JP | 2002-134506 | 5/2002 |
| JP | 2002-270608 | 9/2002 |
| JP | 2003-347510 | 12/2003 |
| JP | 2004-079596 | 3/2004 |
| JP | 2004-179255 | 6/2004 |
| JP | 2004-297022 | 10/2004 |

OTHER PUBLICATIONS

Japanse Official Action—2004-332349—Sep. 21, 2010.
Japanese Office Action dated Jan. 29, 2013 in corresponding Japanese Patent Application No. 2010-257758 with English translation of Japanese Office Action.
JP Office Action dated on Aug. 6, 2013, with English translation; Application No. 2010-257758.
Japanese Official Action—2010-257758—Nov. 26, 2013.

\* cited by examiner

SEMICONDUCTOR DEVICE HAVING AN ANNULAR GUARD RING

This application is based on Japanese patent application NO. 2004-332349, the content of which is incorporated hereinto by reference.

BACKGROUND

1. Technical Field

This invention relates to a semiconductor device comprising a plurality of device regions.

2. Related Art

In order to protect a circuit-forming region in a semiconductor device from moisture or ions in an external atmosphere, a protective structure which is called a "seal ring" is provided inside of a dicing line, that is, in the vicinity of an edge of a chip (die). The seal ring consists of an interconnect layer (Cu) and a contact as in a circuit-forming region, and is formed such that it surrounds the circuit-forming region in the semiconductor device.

The seal ring can also prevent cracks in the circuit-forming region during dicing the dicing region. During dicing, cracks may occur in the dicing region. However, the seal ring between the dicing region and the circuit-forming region prevents the cracks from reaching the circuit-forming region.

Furthermore, a protective film which is called a passivation film is formed in the surface of the semiconductor device in order to protect the surface of the semiconductor device and avoid influence of the external atmosphere.

Japanese Laid-Open Patent Publication No. 2004-79596 has described a conventional semiconductor device comprising a seal ring; specifically, a semiconductor device comprising a seal ring and a passivation film thereover.

SUMMARY OF THE INVENTION

After investigation, the present inventor has found that when a seal ring is formed in an apparatus including both logic-circuit forming region (logic unit) and analog-circuit forming region (analog unit), a device in the analog unit may malfunction. A possible cause was studied using an apparatus with a configuration shown in FIGS. 11 and 12. FIG. 11 is a plan view showing a configuration of a semiconductor device including a seal ring. FIG. 12 is an enlarged cross-sectional view (I-I' cross-sectional view) of the region having the seal ring formed therein (seal ring region 206) in FIG. 11.

As shown in FIGS. 11 and 12, in a semiconductor chip 200, a seal ring region 206 is formed inside of a dicing line 203 in a silicon substrate 201, and in FIG. 12, there are a circuit-forming region (inner circuit region 207) and a dicing region in the left and the right sides, respectively. The seal ring region 206 is closer to the dicing region than the inner circuit region 207.

As shown in FIG. 12, the semiconductor chip 200 has a configuration where on the silicon substrate 201 are sequentially deposited an insulating interlayer 223, an insulating interlayer 227, an insulating interlayer 231, an insulating interlayer 235, an insulating interlayer 239, an insulating interlayer 243 and a passivation film 247. The silicon substrate 201 includes an n-well 211 and a p-well 209 which are mutually adjacent, near its surface. The p-well 209 is formed in the area from the inner circuit region 207 to the seal ring region 206.

In the inner circuit region 207, on the surface of the silicon substrate 201 including the n-well 211 are sequentially deposited a gate oxide film 217 and a gate electrode 219. Over the n-well 211 on the silicon substrate 201 are formed a $p^+$-diffusion layer 213 and an $n^+$-diffusion layer 215, which act as a source/drain region. On the p-well 209 are also sequentially deposited the gate oxide film 217 and the gate electrode 219. Over the p-well 209 on the silicon substrate 201 are formed an $n^+$-diffusion layer 215 and a $p^+$-diffusion layer 213, which act as a source/drain region. The $p^+$-diffusion layer 213, the $n^+$-diffusion layer 215 and the gate electrode 219 are connected to a connection plug 224. The peripheral side of the $p^+$-diffusion layer 213 and the $n^+$-diffusion layer 215 are insulated by a device-separating film 221. The connection plug 224 is a conductive plug which is buried in the insulating interlayer 223 and penetrates the insulating interlayer 223. Its upper surface is connected to an interconnect 226 buried in the insulating interlayer 227.

In the seal ring region 206, near the surface of the silicon substrate 201 is formed the $p^+$-diffusion layer 213, which is in contact with the upper surface of the p-well 209 in the silicon substrate 201. The surface of the $p^+$-diffusion layer 213 is connected to the lower surface of the conductive ring 225 which is buried in and penetrates the insulating interlayer 223. In the direction from the conductive ring 225 toward the upper layer, there are connected a conductive ring 229, a conductive ring 233, a conductive ring 237, a conductive ring 241 and a conductive ring 245 in sequence. The conductive ring 229, the conductive ring 233, the conductive ring 237, the conductive ring 241 and the conductive ring 245 are buried in the insulating interlayer 227, the insulating interlayer 231, the insulating interlayer 235, the insulating interlayer 239 and the insulating interlayer 243, respectively, and penetrate these insulating films. The seal ring 205 consists of the conductive rings 225 to 245. In FIG. 12, there are formed triple seal rings 205.

After investigating operation of the semiconductor chip 200, the present inventor has found that as shown in FIG. 13, a noise generated in a digital unit 251 is transmitted to an analog unit 253 via the seal ring 205. FIG. 13 is a plan view showing a path of noise transmission. According to the investigation of the present inventor, there has been found that in this figure, the noise transmitted to the analog unit 253 via the seal ring 205 causes malfunction of the device in the analog unit 253.

This invention has been achieved on the basis of the new observation of the present inventor described above and involves prevention of noise transmission by forming a nonconducting part in a guard ring forming region.

According to an aspect of this invention, there is provided a semiconductor device with a first and a second device regions, comprising a semiconductor substrate, an insulating interlayer formed on the semiconductor substrate, and an annular guard ring consisting of a conductive film buried in the insulating interlayer and surrounding the periphery of the first device region, wherein a nonconducting part blocking electric conduction in a path from the first device region, through the guard ring to the second device region is formed in a guard ring forming region.

As used herein, the term "guard ring" refers to an annular conducting member surrounding the periphery of at least one device region. The guard ring may be a member provided along an edge (dicing line) in a semiconductor substrate such as a seal ring. It is, however, not essential that the guard ring is formed along the dicing line. For example, the guard ring may be a member surrounding a first device region formed in the center of the semiconductor substrate, and a second device region may be formed at a position closer to the dicing line than the guard ring. The planar shape of the guard ring is not limited to a completely closed ring, but may include a partially defective ring and a ring, a part of which is separated by an insulating interlayer.

As used herein, the term "guard ring forming region" refers to an annular region including a guard ring in a plan view, whether the guard ring is completely annular or not. The region comprises, in addition to the guard ring, for example, a semiconductor substrate and an insulating interlayer formed on the semiconductor substrate.

As used herein, the term "nonconducting part" refers to a part in a guard ring forming region which makes a first region and a second region nonconductive by blocking electric conduction in a path from the first device region, through the guard ring to the second device region. Specific embodiments of the nonconducting part include (i) an insulating region formed in the path and (ii) a pn junction plane formed in the path.

An impedance Z in a certain region is generally represented by equation (1):

$$Z = R + j(\omega L - 1/\omega C) \qquad (1)$$

wherein $\omega$ is a frequency, R is an electrical resistance, L is a self inductance and C is a capacity.

A nonconducting part in this invention has an adequate impedance represented by equation (1) to prevent a noise generated in one of the first device region and the second device region from being transmitted to a practically acceptable degree. Specific embodiments of the nonconducting part include (i) an insulating region formed in the path and (ii) a pn junction plane formed in the path as described above. In (i), R is increased to increase Z in equation (1). In (ii), C is reduced to increase Z in equation (1). As long as transmission of a noise can be reduced to a desired level or less, blocking of conduction by the nonconducting part is adequate. That is, a weak current is acceptable as long as a noise transmission is prevented.

An example of the above (i) is a configuration that in a region comprising a nonconducting part, a semiconductor substrate and a guard ring are separated by an insulating film constituting the nonconducting part while in a region other than the region comprising the nonconducting part, a guard ring is connected with the semiconductor substrate. In this configuration, the nonconducting part comprising an insulating film has a large R in equation (1), so that it can block conduction.

An example of the above (ii) is a configuration that near the surface of a semiconductor substrate, a diffusion layer having an opposite conductivity type to that of the semiconductor substrate is provided; a guard ring is connected to the surface of the semiconductor substrate in the region comprising the diffusion layer having the opposite conductivity type; and a junction plane in the diffusion layer constitutes a nonconducting part. Herein, in accordance with equation (1), C can be reduced to suitably increase Z. Thus, noise transmission between the first device region and the second device region can be effectively prevented. An impurity concentration profile in the diffusion layer with an opposite conductivity type may be selected from various types without any particular restrictions.

The aspect of the above (ii) is particularly effective for a configuration that an analog and a digital circuit devices are formed in either the first device region or the second device region. In such a configuration, when a noise generated in the digital circuit device is transmitted through the above path, an impedance Z can be suitably increased by effectively reducing the total capacity C in the path. When $\omega$ is small in equation (1), such an effect can be more significant, to effectively prevent transmission of a low-frequency noise.

As described above, the present inventor has found that a noise generated in a certain device region is transmitted to another device region through a guard ring such as a seal ring, causing, for example, malfunction in a device in the other device region. In this invention, a nonconducting part is formed in a guard ring forming region. The nonconducting part blocks conduction in a path from the first device region, through the guard ring to the second device region, so that noise transmission between the first and the second device regions can be reliably prevented.

Thus, according to this invention, noise transmission through a guard ring intervening between two device regions can be effectively prevented.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of this invention will be described with reference to the drawings. In all of these drawings, a common component is denoted by the same symbol, whose description is appropriately unrepresented. For these embodiments, a case where a guard ring is a seal ring formed along the edge of a semiconductor substrate is mainly described. However, this invention is not limited to such a case, but a guard ring may be disposed in any appropriate region in a device forming surface in the substrate. It will be described later with reference to FIG. 10.

Embodiment 1

Figure 1:
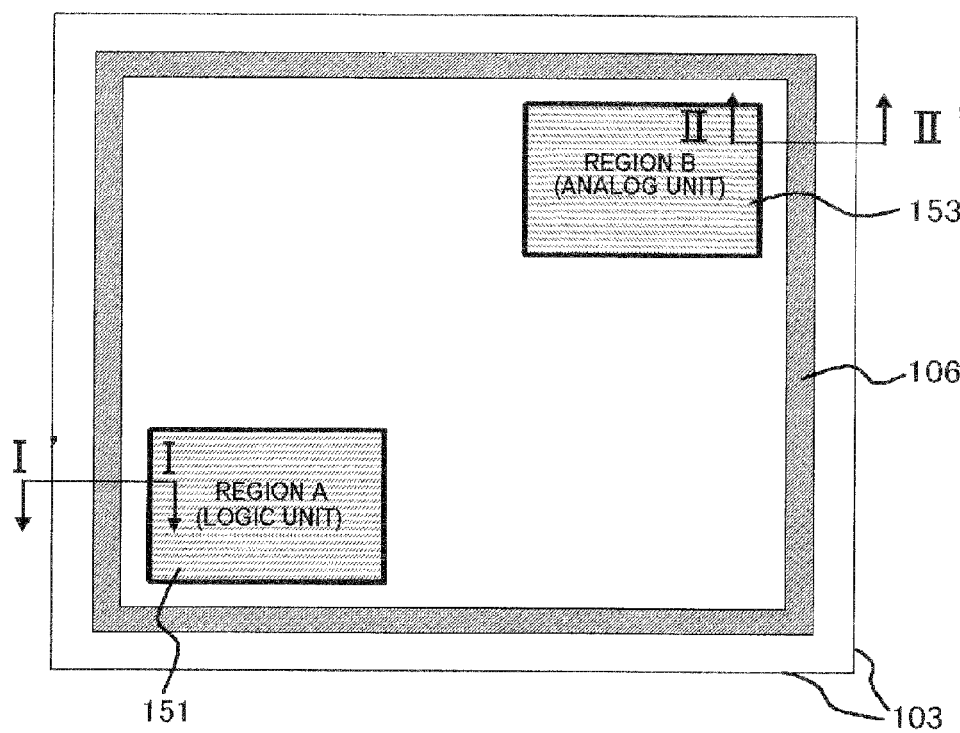
FIG. 1 is a plan view showing a configuration of a semiconductor device according to an embodiment of this invention.

FIG. 1 is a plan view showing a configuration of a semiconductor chip in this embodiment. A semiconductor chip 100 shown in FIG. 1 includes two device regions, that is, a logic unit 151 (region A) and an analog unit 153 (region B) in a silicon substrate 101. The semiconductor chip 100 includes a annular seal ring region 106 surrounding these device regions along a dicing plane 103. There will be described an exemplary configuration where a seal ring 105 (FIGS. 2 and 3) formed in the seal ring region 106 is comprised of a triple-layered annular conductive plug.

Figure 2:
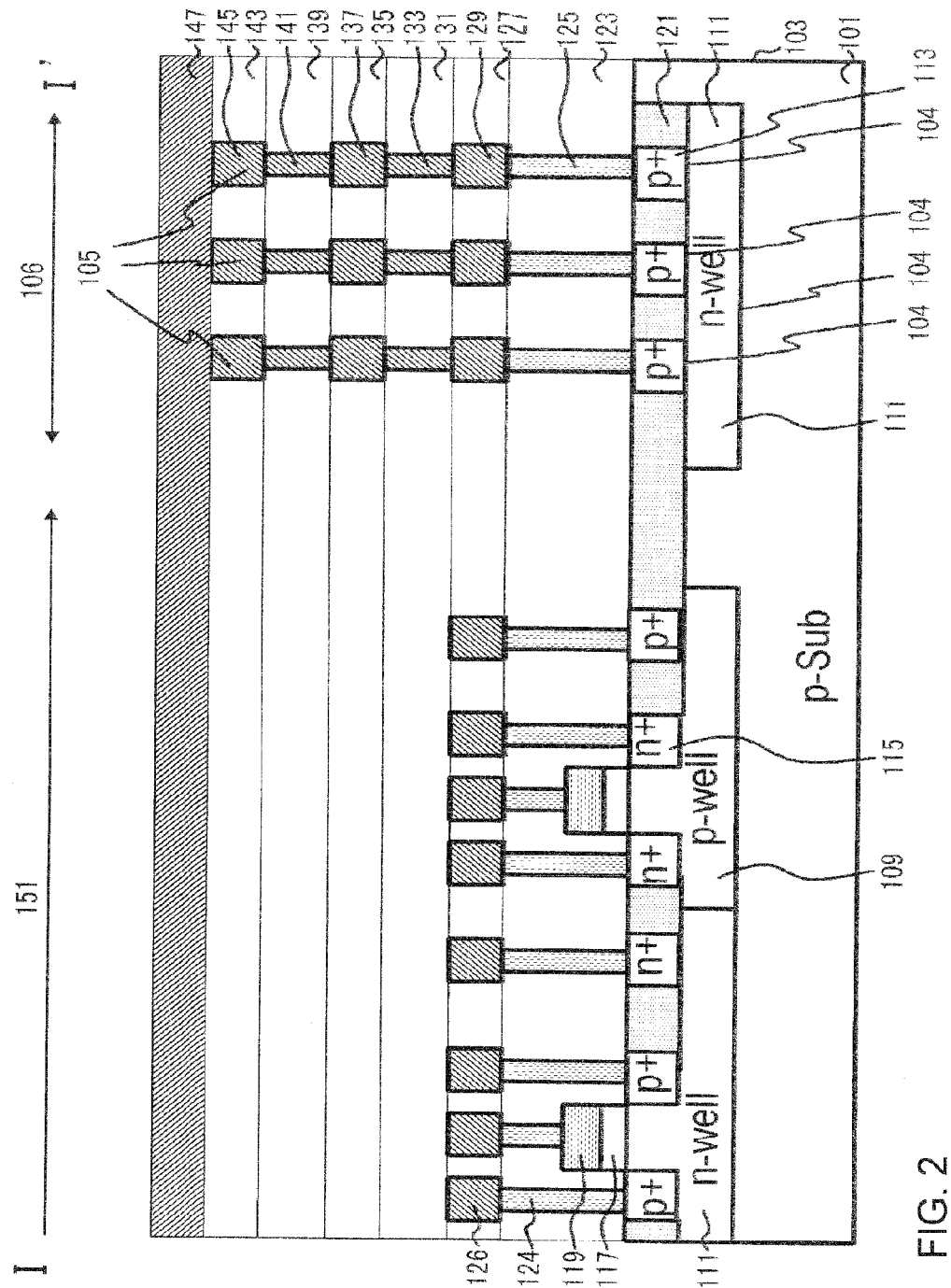
FIG. 2 is a cross-sectional view taken on line I-I' of FIG. 1.
Figure 3:
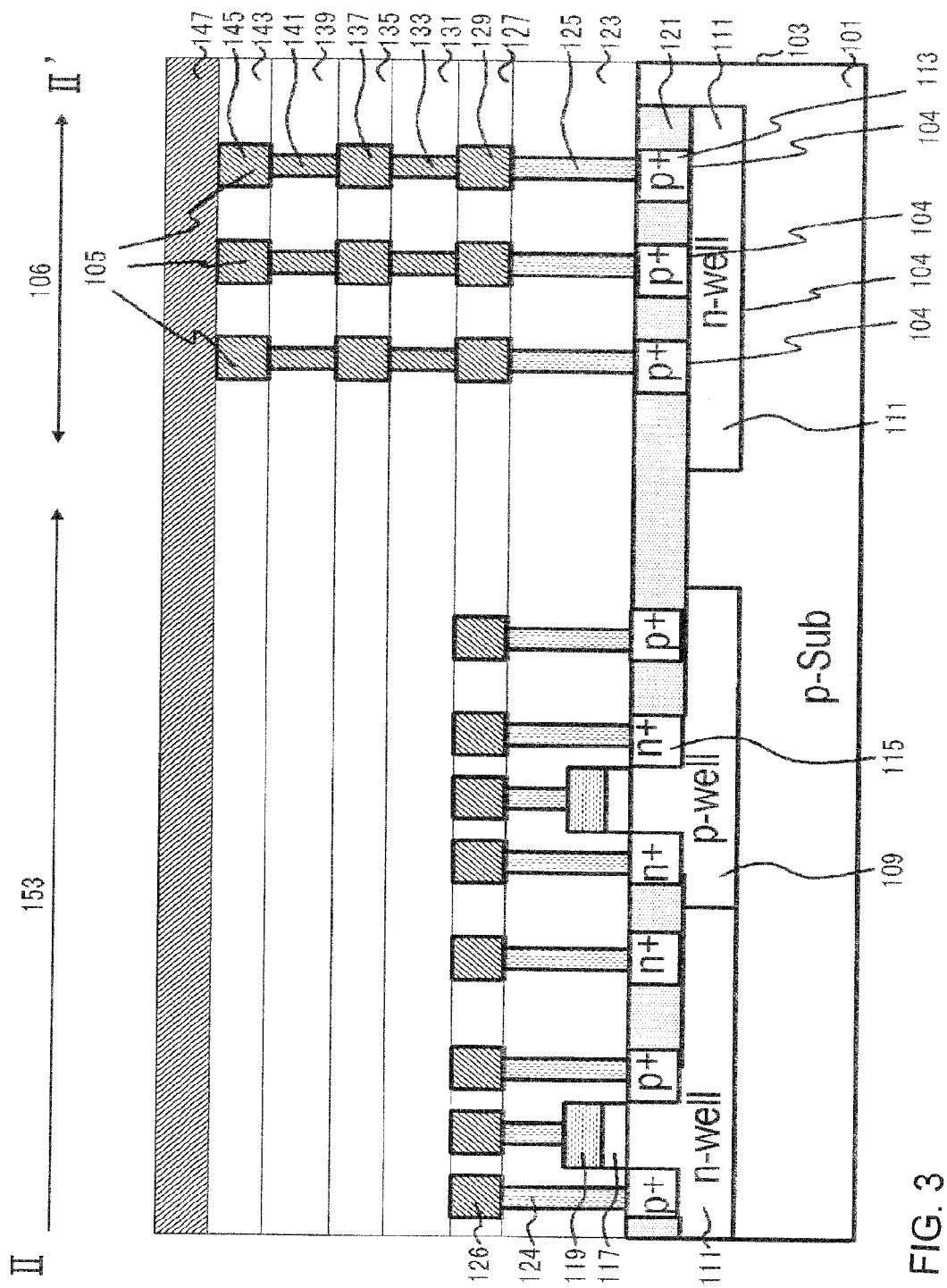
FIG. 3 is a cross-sectional view taken on line II-II' of FIG. 1.

FIG. 2 is a cross-sectional view taken on line I-I' of FIG. 1, and FIG. 3 is a cross-sectional view taken on line II-II' of FIG. 1. Each of FIGS. 2 and 3 shows a configuration of the seal ring region 106 and an internal circuit adjacent to the region.

The semiconductor chip 100 shown in FIGS. 1 to 3 is a semiconductor device comprising the first and the second device regions (the logic unit 151 and the analog unit 153), comprising a semiconductor substrate (a silicon substrate 101); an insulating interlayer (a first insulating film 123, a second insulating film 127, a third insulating film 131, a fourth insulating film 135, a fifth insulating film 139 and a sixth insulating film 143) formed on the semiconductor substrate; and conductive films (a first conductive ring 125, a second conductive ring 129, a third conductive ring 133, a fourth conductive ring 137, a fifth conductive ring 141 and a sixth conductive ring 145) buried in the insulating interlayer.

The semiconductor chip 100 comprising a annular guard ring (a seal ring 105) surrounding the periphery of the logic unit 151 or the analog unit 153 has a configuration where a nonconducting part 104 blocking conduction of a path from the logic unit 151, through the seal ring 105 to the analog unit 153 is formed in a guard ring forming region (a seal ring region 106). In this embodiment, the seal ring 105 surrounds the periphery of both the logic unit 151 and the analog unit 153.

The seal ring 105 is disposed along the edge of the silicon substrate 101 and surrounds the periphery of the logic unit 151 and the analog unit 153. The seal ring 105 includes multiple ring-shaped conductive films along the edge of the silicon substrate 101 which are stacked via the insulating interlayer.

The nonconducting part 104 is disposed in the vicinity of the logic unit 151 or the analog unit 153. In this embodiment, the seal ring 105 is in the vicinity of both logic unit 151 and analog unit 153. The nonconducting part 104 has a planar shape where it extends over the whole region immediately below the first conductive ring 125.

In the seal ring region 106 in the semiconductor chip 100, there are formed a first diffusion layer (a p$^+$-diffusion layer 113) having the same conductivity type to that of the silicon substrate 101 near the surface of the silicon substrate 101, and a second diffusion layer (an n-well 111) having an opposite conductivity type to that of the silicon substrate 101 in contact with the lower surface of the p$^+$-diffusion layer 113. The seal ring 105 is in contact with the surface of the p$^+$-diffusion layer 113. The lower surface of the p$^+$-diffusion layer 113 and the lower surface of the n-well 111 constitute the nonconducting part 104. The side periphery of the p$^+$-diffusion layer 113 is covered and insulated by the device-separating film 121.

In this configuration, the seal ring 105 includes multiple ring-shaped conductive films which are stacked via the insulating interlayer. In the region where the nonconducting part 104 is to be formed, the seal ring 105 includes a plurality of columnar conductive plugs connected to the surface of the p$^+$-diffusion layer 113. In the region where the nonconducting part 104 is to be formed, the conductive plugs may be arranged as a diagonal lattice in the plane.

There will be further detailed the semiconductor chip 100 in FIGS. 1 to 3.

As shown in FIGS. 2 and 3, in the semiconductor chip 100, there are sequentially formed the first insulating film 123, the second insulating film 127, the third insulating film 131, the fourth insulating film 135, the fifth insulating film 139, the sixth insulating film 143 and the passivation film 147 on the silicon substrate 101 (p substrate).

The logic unit 151 and the analog unit 153 include an n-well 111 and a p-well 109 which are mutually adjacent, in the vicinity of the surface of the silicon substrate 101. The end of the p-well 109 is within the logic unit 151 or the analog unit 153.

On the surface of the silicon substrate 101 including the n-well 111, a gate oxide film 117 and a gate electrode 119 are formed in sequence. In the region over the n-well 111 in the silicon substrate 101 are provided a p$^+$-diffusion layer 113 and an n$^+$-diffusion layer 115, which act as a source/drain region. Also, over the p-well 109 are formed a gate oxide film 117 and a gate electrode 119 in sequence. In the region over the p-well 109 in the silicon substrate 101 are provided an n$^+$-diffusion layer 115 and a p$^+$-diffusion layer 113, which act as a source/drain region. The p$^+$-diffusion layer 113 and the n$^+$-diffusion layer 115 are separated by a device-separating film 121.

The p$^+$-diffusion layer 113, the n$^+$-diffusion layer 115 and the gate electrode 119 are connected to the connection plug 124. The connection plug 124 is a conductive plug which is buried in the first insulating film 123 and penetrates the first insulating film 123. The upper surface of the connection plug 124 is connected to the first interconnect 126 buried in the second insulating film 127.

In the region (seal ring region 106) where the seal ring 105 is formed, the n-well 111 is formed in the vicinity of the surface of the silicon substrate 101 (p substrate), and the p$^+$-diffusion layer 113 is formed in contact with the surface of the p-well 109. The side periphery of each p$^+$-diffusion layer 113 is insulated by the device-separating film 121. The first conductive ring 125 provided in the first insulating film 123 is connected to the p$^+$-diffusion layer 113 on its bottom surface and to the bottom of the second conductive ring 129 on its upper surface. In the direction from the first conductive ring 125 toward the upper layer, there are sequentially connected a second conductive ring 129, a third conductive ring 133, a fourth conductive ring 137, a fifth conductive ring 141 and a sixth conductive ring 145. The n-well 111 in the seal ring region 106 and the p-well 109 in the analog unit 153 are separated by the silicon substrate 101 (p substrate).

The second conductive ring 129, the third conductive ring 133, the fourth conductive ring 137, the fifth conductive ring 141 and the sixth conductive ring 145 are made of conductive materials buried in grooves formed in the second insulating film 127, the third insulating film 131, the fourth insulating film 135, the fifth insulating film 139 and the sixth insulating film 143, respectively, and penetrate these insulating films. These conductive rings are made of a metal such as copper (Cu) and can be formed by an appropriate method such as a single damascene process and a dual damascene process.

The connection plug 124 and the first conductive ring 125 are disposed in the same level as the layer structure (first layer) formed on the silicon substrate 101, and these can be formed from the same material in a single process. Likewise, the first interconnect 126 and the second conductive ring 129 are disposed in the same level as the above layer structure, and these can be formed from the same material in a single process.

Between the seal ring 105 consisting of the first conductive ring 125 to the sixth conductive ring 145 and the silicon substrate 101, there are two pn junctions, that is, (i) a junction between the p$^+$-diffusion layer 113 and the n-well 111; and (ii) a junction between the n-well 111 and the silicon substrate 101.

Near the junction interface in these pn junction parts, a carrier depletion layer is formed, leading to generation of a capacity. In this embodiment, such capacities are serially aligned in a path from the logic unit 151, through the seal ring 105 to the analog unit 153. Therefore, the junctions act as a nonconducting part 104, and can also reduce the sum of a capacity C in equation (1), resulting in effective increase in an impedance Z in the path.

There will be described a process for manufacturing the semiconductor chip 100 shown in FIGS. 1 to 3.

The semiconductor chip 100 can be prepared by using a conventional process, for example, as described below. First, on a silicon substrate 101 is formed a device-separating film 121 (STI: shallow trench isolation). Next, on the silicon substrate 101 is formed a gate oxide film 117 such as an SiO$_2$ film, on which is then formed a gate electrode 119 such as a polycrystalline silicon film, and a gate is formed in a given area on the silicon substrate 101. Then, a p-well 109 and an n-well 111 are formed at predetermined positions near the surface of the silicon substrate 101. Furthermore, at predetermined positions near the surface of the silicon substrate 101 above the p-well 109 and the n-well 111 are formed a p$^+$-diffusion layer 113 and an n$^+$-diffusion layer 115.

Subsequently, over the whole upper surface of the silicon substrate 101 is deposited a first insulating film 123, and a mask pattern is formed by photolithography, which has an opening over regions in the first insulating film 123 where a connection plug 124 and a first conductive ring 125 are to be formed. Then, the regions where a connection plug 124 and a first conductive ring 125 are to be formed are selectively removed. Then, over the whole upper surface of the silicon substrate 101 is formed a metal film for the connection plug 124 and the first conductive ring 125. The metal film may be comprised of, for example, a barrier metal film as a layered film where a titanium (Ti) film and a titanium nitride (TiN) film are sequentially formed from the bottom and a tungsten (W) film filling the concave, which is in contact with the barrier metal film. Then, the metal film over the first insulating film 123 is removed by, for example, CMP (chemical mechanical polishing). Thus, the connection plug 124 and the first conductive ring 125 are formed.

Next, over the whole upper surface of the first insulating film 123 is formed a second insulating film 127. As described above, regions in the second insulating film 127 where a first interconnect 126 and a second conductive ring 129 are to be formed are selectively removed to form a concave. Then, over the whole upper surface of the second insulating film 127 are sequentially formed a barrier metal film as a multilayered film where a tantalum (Ta) film and a tantalum nitride (TiN) film are sequentially formed from the bottom, and a Cu film filling the concave, which is in contact with the barrier metal film. Furthermore, the metal film formed over the second insulating film 127 is removed by, for example, CMP. Thus, the first interconnect 126 and the second conductive ring 129 are formed.

Likewise, by a damascene process are sequentially formed a third insulating film 131, a third conductive ring 133, a fourth insulating film 135, a fourth conductive ring 137, a fifth insulating film 139, a fifth conductive ring 141, a sixth insulating film 143 and a sixth conductive ring 145. Then, over the whole upper surface of the sixth conductive ring 145 is formed a passivation film 147 such as a multilayered film in which an SiN film, an SiO$_2$ film, an SiO$_2$ film and an SiN film are sequentially formed from the bottom. In an area closer to the dicing plane 103 than the seal ring 105 in the passivation film 147, an annular groove may be formed, which penetrates the passivation film 147 and surrounds the periphery of the seal ring 105. Thus, transmission of cracks toward the inside of the substrate can be more reliably prevented during the step of dicing in manufacturing the semiconductor chip 100. As described above, the semiconductor chip 100 can be prepared.

The first insulating film 123 to the sixth insulating film 143 may be, for example, SiO$_2$ films. These insulating interlayers may be low dielectric-constant film. As used herein, a low dielectric-constant film refers to a film with a specific dielectric constant "k" of, for example, 3.5 or less. Examples of such a film include an SiOC film, a hydrogen polysiloxane film, a methylpolysiloxane film, a methyl hydrogen polysiloxane film and these films which have been made porous. The low dielectric-constant film may be made of an organic polymer.

Between the insulating films, that is, the first to the sixth insulating films 123 to 143, there may be formed an insulating film such as an SiN film, which acts as an etching stopper film or a diffusion barrier.

Next, there will be described effects of the semiconductor chip 100.

In the semiconductor chip 100, there is formed the nonconducting part 104 in the seal ring region 106 as a region where the seal ring 105 is to be formed. In the nonconducting part 104, the first conductive ring 125 as the bottom layer of the seal ring 105 is connected, via the p$^+$-diffusion layer 113, to the n-well 111 having an opposite conductivity type to the silicon substrate 101. Between the first conductive ring 125 and the silicon substrate 101, there is formed a pn junction which acts as the nonconducting part 104. The seal ring 105 and the silicon substrate 101 are separated by a capacity junction in the nonconducting part 104, resulting in extension of a depletion layer in the junction. An impedance represented by equation (1) may be, therefore, increased, to prevent noise transmission. Furthermore, the side periphery of the p$^+$-diffusion layer 113 connected to the first conductive ring 125 is separated and insulated from the silicon substrate 101 by the device-separating film 121. It can also adequately block the noise transmission path via the silicon substrate 101 from the lateral side of the p$^+$-diffusion layer 113.

Thus, it can prevent transmission of a noise generated in the logic unit 151 to the analog unit 153, via, for example, a path from the silicon substrate 101, the seal ring 105 and the silicon substrate 101 in sequence. Thus, malfunction of a device in the analog unit 153 can be prevented.

In this embodiment, in the vicinity of both the logic unit 151 and the analog unit 153, there are two junctions which act as a nonconducting part 104 and where a conductivity type is inverted, between the p$^+$-diffusion layer 113 and the n-well 111 and between the n-well 111 and the silicon substrate 101 (p substrate). Therefore, as later described in Embodiments 2 and 3 (FIGS. 4 and 5), transmission of a low-frequency noise to the analog unit 153 can be more reliably prevented in comparison with a configuration where there exists one part inverting a conductivity type.

In Embodiments 2 and 3 described later, regions in the vicinity of a logic unit 151 and an analog unit 153 include a nonconducting part 104. Therefore, more nonconducting parts 104 can be serially aligned in a path from the logic unit 151 to the analog unit 153, in comparison with a configuration where a nonconducting part 104 is formed only in a region in the vicinity of the analog unit 153, as later described in Embodiments 4 to 6.

In this embodiment, the nonconducting part 104 formed below the diffusion layer with an opposite conductivity type to the surface of the silicon substrate 101 is a junction plane between the n-well 111 and the silicon substrate 101 (p substrate). Therefore, a junction capacity in the nonconducting part 104 is smaller than that in a configuration where the nonconducting part 104 is a junction plane between the $n^+$-diffusion layer 115 and the silicon substrate 101, as later described in Embodiment 3.

As described above, in the semiconductor chip 100, as many as four nonconducting parts 104 are serially aligned in the conduction path from the logic unit 151, through the seal ring 105 to the analog unit 153. Furthermore, a capacity in a pn junction as one nonconducting part 104 can be suitably reduced to suitably reduce C in the above equation (1). Thus, the sum of the capacity C in the path can be effectively reduced to suitably increase an impedance Z. This effect is significant when ω in the above equation (1) is small, resulting in more effective reduction in transmission of a low-frequency noise in the semiconductor chip 100.

In the semiconductor chip 100, the $p^+$-diffusion layer 113 as a nonconducting part 104 can be formed in one step simultaneously with the $p^+$-diffusion layers 113 formed in the logic unit 151 and the analog unit 153. Furthermore, the n-well 111 as a nonconducting part 104 can be also formed in one step simultaneously with the n-wells 111 formed in the logic unit 151 and the analog unit 153. This configuration can be, therefore, easily manufactured without any additional manufacturing steps for forming the nonconducting part 104.

In addition, in the semiconductor chip 100, the nonconducting part 104 is formed over the whole region where the seal ring 105 is to be formed. A device configuration can be, therefore, further simplified in comparison with Embodiments 4 to 6 described later, resulting in further easier production of the device.

In the whole periphery of the seal ring 105, the seal ring 105 is in contact with the surface of the silicon substrate 101. Therefore, in the whole periphery of the dicing plane 103 in the semiconductor 100, its function as a seal ring is suitably ensured, compared to Embodiment 7 described later. Furthermore, the whole upper surface of the seal ring 105 is covered by the passivation film 147. It can prevent cracks generated during dicing from reaching the logic unit 151 or the analog unit 153 disposed inside of the seal ring 105. In addition, the semiconductor chip 100 is protected from influence by moisture or ions from the external atmosphere.

Since the seal ring 105 is in contact with the surface of the silicon substrate 101, a charge can be let go to the silicon substrate even when plasma is employed in manufacturing the seal ring 105, as described in Embodiment 7. Thus, charge storage in the seal ring 105 due to such a manufacturing process can be prevented. Therefore, while adequately ensuring the function as a seal ring 105, noise transmission between the logic unit 151 and the analog unit 153 can be prevented and reliability in manufacturing can be improved.

Thus, since intra-chip distribution of a digital noise by the seal ring 105 is reduced in the semiconductor chip 100, the chip can be suitably used in, for example, a semiconductor integrated circuit having a digital region and an analog region together.

In FIGS. 2 and 3, there have been described a configuration where the n-well 111 in the seal ring region 106 and the p-well 109 in the logic unit 151 or the analog unit 153 are separated, but these may be in contact with each other. In the configuration where the n-well 111 and the p-well 109 are separated by the silicon substrate 101 (p substrate) as shown in FIGS. 2 and 3, the pn junction part in the lateral side of the n-well 111 becomes junction between the n-well 111 and the silicon substrate 101 (p substrate), so that a junction capacity can be reduced in comparison with a configuration where the n-well 111 is in contact with the p-well 109 in a pn junction. Therefore, an impedance between the logic unit 151 and the analog unit 153 can be further effectively increased to further effectively prevent noise transmission via the lateral side of the n-well 111.

In FIGS. 2 and 3, there is shown a configuration where the $p^+$-diffusion layer 113 is formed in each of the first conductive rings 125. However, one common $p^+$-diffusion layer 113 may be formed for these first conductive rings 125. By separately forming the $p^+$-diffusion layers 113 to the individual first conductive rings 125, the effect of increasing an impedance can be further significant.

In FIGS. 2 and 3, there is shown a configuration where one n-well 111 is formed over the whole bottom surface of the seal ring 105 consisting of a plurality (three in this embodiment) of annular conductive members. The n-well 111 may be separately formed below each of the $p^+$-diffusion layers 113. Thus, noise transmission between the logic unit 151 and the analog unit 153 may be further effectively prevented.

In FIGS. 2 and 3, there is shown a configuration where an annular concave is formed in the first insulating film 123 and the first conductive ring 125 is buried in the concave. In this embodiment and the other embodiments herein, there may be equiangularly a plurality of cylindrical concaves in the first insulating film 123 as well as a concave for forming the connection plug 124, and there may be a plurality of columnar conductive plugs buried in the individual concaves, which are connected the second conductive ring 129 and have the same cross-sectional shape as the first conductive ring 125 (FIGS. 2 and 3). Using the columnar conductive plugs in place of the first conductive ring 125, a resistance of the seal ring 105 can be increased in the layer of the first insulating film 123, so that transmission of a low-frequency noise to the analog unit 153 can be more reliably prevented.

When using a columnar conductive plug in the first insulating film 123 in place of the first conductive ring 125, a plurality of conductive plugs may be arranged as a diagonal lattice such as a staggered (hound's tooth) lattice in the plane. Thus, the layer of the first insulating film 123 can also further effectively act as the seal ring 105.

In the embodiments below, there will be mainly described the aspects different from those in Embodiment 1.

Embodiment 2

Figure 4:
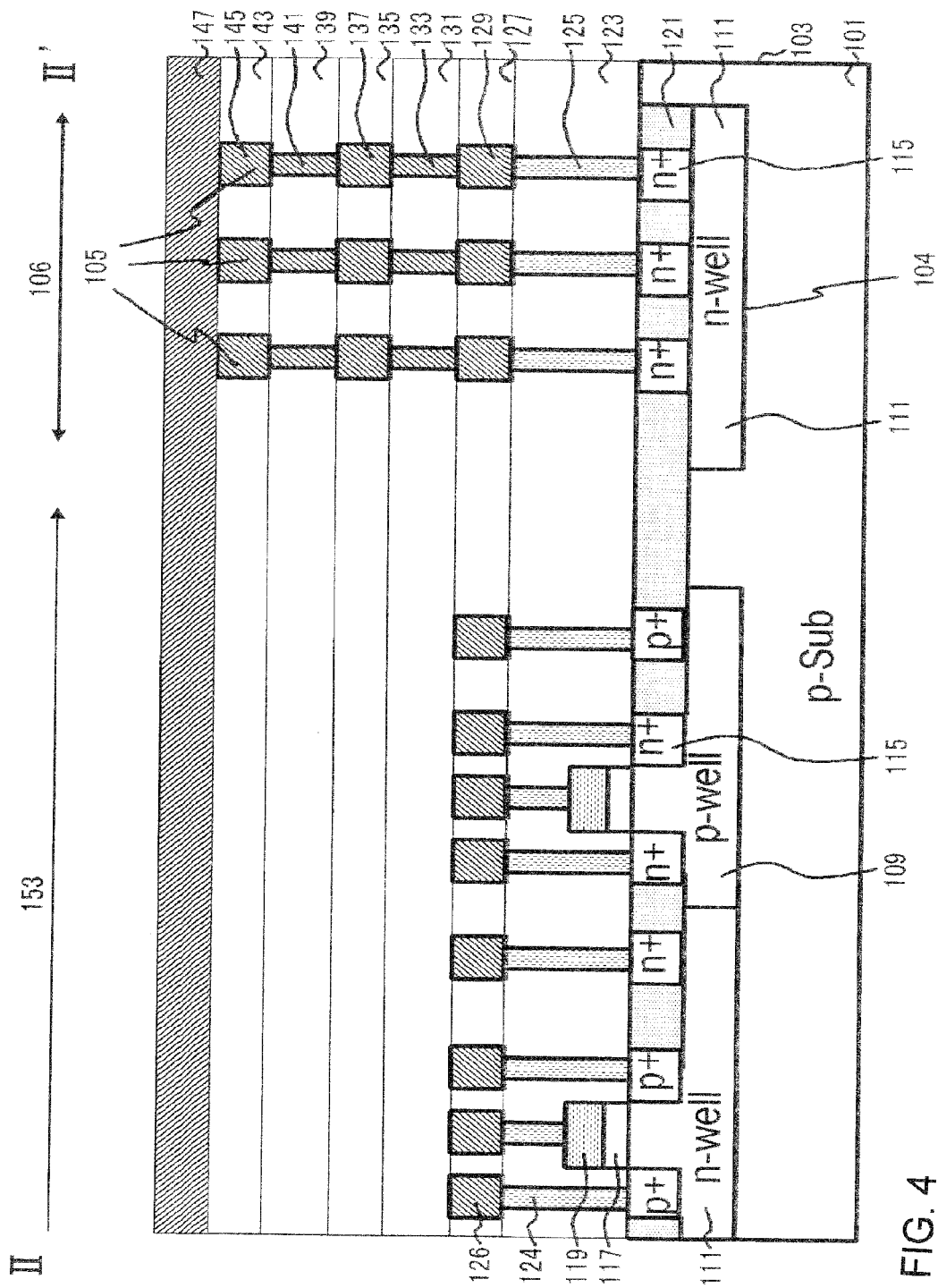
FIG. 4 is a cross-sectional view showing a semiconductor device according to an embodiment of this invention.

In the semiconductor chip described in Embodiment 1, the seal ring region 106 may have the following cross-sectional structure. In this embodiment, a planar configuration in the semiconductor chip may be also as described with reference to FIG. 1. FIG. 4 is a cross-sectional view showing a configuration of the semiconductor device according to this embodiment. Although FIG. 4 shows a cross-sectional view taken on line II-II' of FIG. 1 which corresponds to FIG. 3 in Embodiment 1, the I-I' cross-section may have the configuration in FIG. 4, in which the analog unit 153 in FIG. 4 is the logic unit 151.

As shown in FIG. 4, the semiconductor device of this embodiment includes a diffusion layer (an $n^+$-diffusion layer 115 and an n-well 111) with an opposite conductivity type to that of a silicon substrate 101 near the surface of the silicon substrate, and a seal ring 105 is connected to the surface of the $n^+$-diffusion layer 115. Furthermore, a junction plane in the n-well 111 is a nonconducting part 104.

In this configuration, the seal ring 105 includes multiple conductive rings (a first conductive ring 125 to a sixth conductive ring 145), which are adjacent via a first insulating film 123 to a sixth insulating film 143. In a region where a nonconducting part 104 is to be formed, the seal ring 105 includes a plurality of columnar conductive plugs which are connected to the surface of the n-well 111. In the region where a nonconducting part 104 is to be formed, conductive plugs may be arranged as a diagonal lattice in the plane.

More specifically, the logic unit 151 and the analog unit 153 may have the cross-sectional structures as described in Embodiment 1. As shown in FIG. 4, the basic configuration of the seal ring region 106 is as shown in FIGS. 2 and 3, except that an $n^+$-diffusion layer 115 is formed in place of the $p^+$-diffusion layer 113 over the n-well 111 in the silicon substrate 101 and that the bottom of the first conductive ring 125 is connected to the surface of the silicon substrate 101 in which the $n^+$-diffusion layer 115 is formed. The lateral peripheries of individual $n^+$-diffusion layers 115 are covered by a device-separating film 121 and separated each other.

Figure 5:
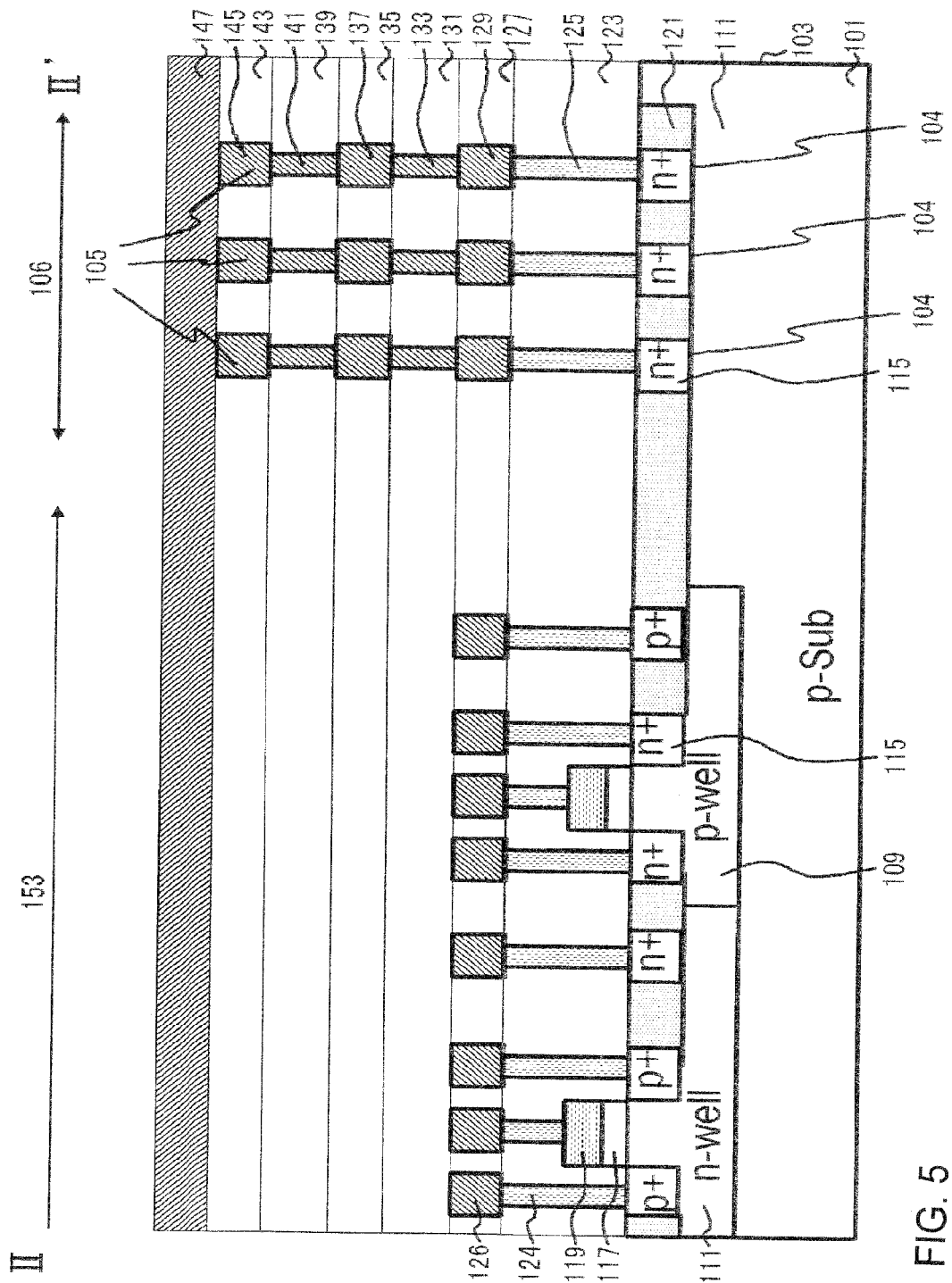
FIG. 5 is a cross-sectional view showing a semiconductor device according to an embodiment of this invention.

In FIG. 4 and FIG. 5 described later in Embodiments 3 and 6, there is shown a configuration where a separate $n^+$-diffusion layer 115 is formed each of the first conductive rings 125, but a common $n^+$-diffusion layer 115 may be formed for the individual first conductive rings 125. By forming a separate $n^+$-diffusion layer 115 to each of the first conductive rings 125, the effect of increase in an impedance can be further significant.

FIG. 4 shows a configuration where one n-well 111 extends under the whole area of the plurality of (three in FIG. 4) the $n^+$-diffusion layers 115, but as described in Embodiment 1, an n-well 111 may be separately formed under each of the $n^+$-diffusion layer 115. Thus, noise transmission between the logic unit 151 and the analog unit 153 can be further effectively prevented.

Again, in this embodiment, the bottom of the seal ring 105, that is, the bottom of the first conductive ring 125 is in contact with the surface of the silicon substrate 101 comprising the $n^+$-diffusion layer 115 having an opposite conductivity type to the silicon substrate 101 (p substrate). As a nonconducting part 104, there is formed a junction between the n-well 111 below the $n^+$-diffusion layer 115 and the silicon substrate 101 (p substrate). Two nonconducting parts 104 formed by pn junctions are arranged in series in the path from the logic unit 151, through the seal ring 105 to the analog unit 153, and the seal ring 105 and the silicon substrate 101 are separated by a capacity junction in the nonconducting part 104, so that an impedance can be increased to prevent noise transmission as described in Embodiment 1.

Furthermore, comparing the configuration of this embodiment with that of Embodiment 3 below, Embodiment 3 (FIG. 5) includes the $n^+$-diffusion layer 115 near the surface of the silicon substrate 101 (p substrate) immediately under the first conductive ring 125, while this embodiment (FIG. 4) includes the n-well 111 in addition to the $n^+$-diffusion layer 115. A capacity between the n-well 111 and the silicon substrate 101 is smaller than that between the $n^+$-diffusion layer 115 and the silicon substrate 101. The configuration shown in FIG. 4 can, therefore, reduce a junction capacity in comparison with Embodiment 3. Thus, this embodiment has a feature that an impedance can be further effectively increased by the nonconducting part 104, resulting in more reliable prevention of noise transmission.

Again, in FIG. 4, the n-well 111 in the seal ring region 106 and the p-well 109 in the logic unit 151 or the analog unit 153 is separated as in FIGS. 2 and 3. A junction capacity can be, therefore, reduced in comparison with a configuration where the n-well 111 is in contact with the p-well 109 to form a pn junction. Thus, an impedance between the logic unit 151 and the analog unit 153 can be further effectively increased.

Embodiment 3

In the semiconductor chip described in Embodiment 1, the seal ring region 106 may have the following cross-sectional configuration. Again, in this embodiment, a planar configuration of the semiconductor chip is as described with reference to FIG. 1. FIG. 5 is a cross-sectional view showing the configuration of the semiconductor device according to this embodiment. Although FIG. 5 shows a cross-sectional view taken on line II-II' of FIG. 1 which corresponds to FIG. 3 in Embodiment 1, the I-I' cross-section may have the configuration in FIG. 5, in which the analog unit 153 in FIG. 5 is the logic unit 151.

As shown in FIG. 5, in the semiconductor device of this embodiment, seal ring region 106 has a basic configuration as described for the semiconductor chip in Embodiment 2, except that an n-well 111 is not formed in a silicon substrate 101.

Again, in this embodiment, the bottom of the seal ring 105, that is, the bottom of the first conductive ring 125 is in contact with the surface of the silicon substrate 101 comprising the $n^+$-diffusion layer 115 having an opposite conductivity type to the silicon substrate 101 (p substrate). As a nonconducting part 104, there is formed a junction between the $n^+$-diffusion layer 115 and the silicon substrate 101 (p substrate). Thus, in this embodiment, as in Embodiment 2, two nonconducting parts 104 formed by pn junctions are arranged in series in the path from the logic unit 151, through the seal ring 105 to the analog unit 153, and the seal ring 105 and the silicon substrate 101 are separated by a capacity junction in the nonconducting part 104, so that an impedance can be increased to prevent noise transmission.

In FIG. 5, a $n^+$-diffusion layer 115 is formed for each of the plurality of the first conductive rings 125. Thus, in comparison with a configuration where one $n^+$-diffusion layer 115 is formed under the whole area of the plurality of the first conductive rings 125, the effect of increasing an impedance can be further significant.

Again, in this embodiment, the p-well 109 does not extend over the seal ring region 106, but is terminated at the logic unit 151 or the analog unit 153. Furthermore, a pn junction plane acting as a nonconducting part 104 is a junction plane between the $n^+$-diffusion layer 115 and the silicon substrate 101 (p substrate). If the p-well 109 extends over the seal ring region 106, a pn junction plane is a junction plane between the $n^+$-diffusion layer 115 and the p-well 109. In contrast, in this embodiment, by forming not the p-well 109 but a junction plane between the $n^+$-diffusion layer 115 and the silicon substrate 101 (p substrate), a junction capacity can be further reduced. Thus, an impedance can be further effectively increased to more reliably prevent noise transmission.

Embodiment 4

Although the nonconducting part 104 is formed over the whole seal ring region 106 in Embodiments 1 to 3, the nonconducting part 104 shown in FIGS. 3 to 5 may be formed in the vicinity of at least the logic unit 151 or the analog unit 153. This and the later embodiments will be specifically described with reference to a configuration where the nonconducting part 104 is formed in the vicinity of the analog unit 153. Furthermore, in this embodiment, there will be described a configuration having the nonconducting part 104 as described in Embodiment 1. A semiconductor chip in which the nonconducting part 104 is as described in Embodiment 2 or 3 will be later described in Embodiment 5 or 6, respectively.

Figure 6:
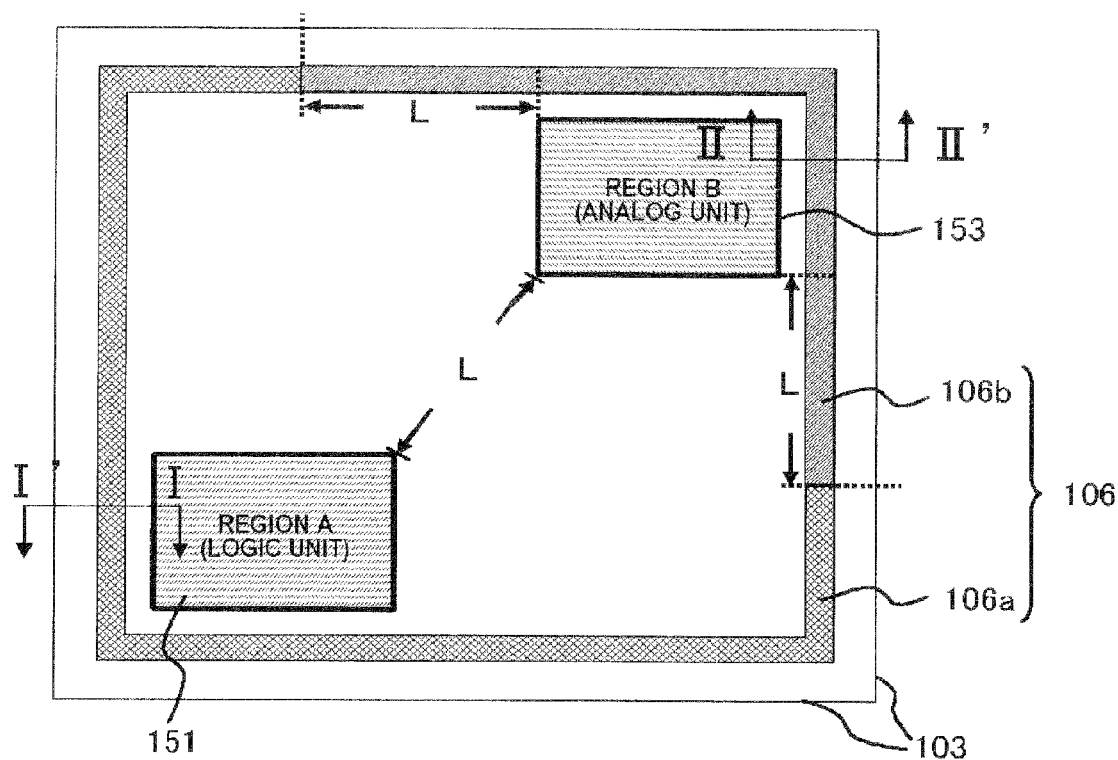
FIG. 6 is a plan view showing a semiconductor device according to an embodiment of this invention.

FIG. 6 is a plan view showing a configuration of a semiconductor chip according to this embodiment. The semiconductor chip shown in FIG. 6 has a basic configuration as described for the semiconductor chip 100 (FIG. 1) in Embodiment 1, except that a seal ring region 106 includes a first region 106a having a cross-sectional structure shown in FIG. 7 later and a second region 106b having a cross-sectional structure shown in FIG. 3 described above. The first region 106a is a region without a nonconducting part 104, while the second region 106b is a region comprising a nonconducting part 104.

Figure 7:
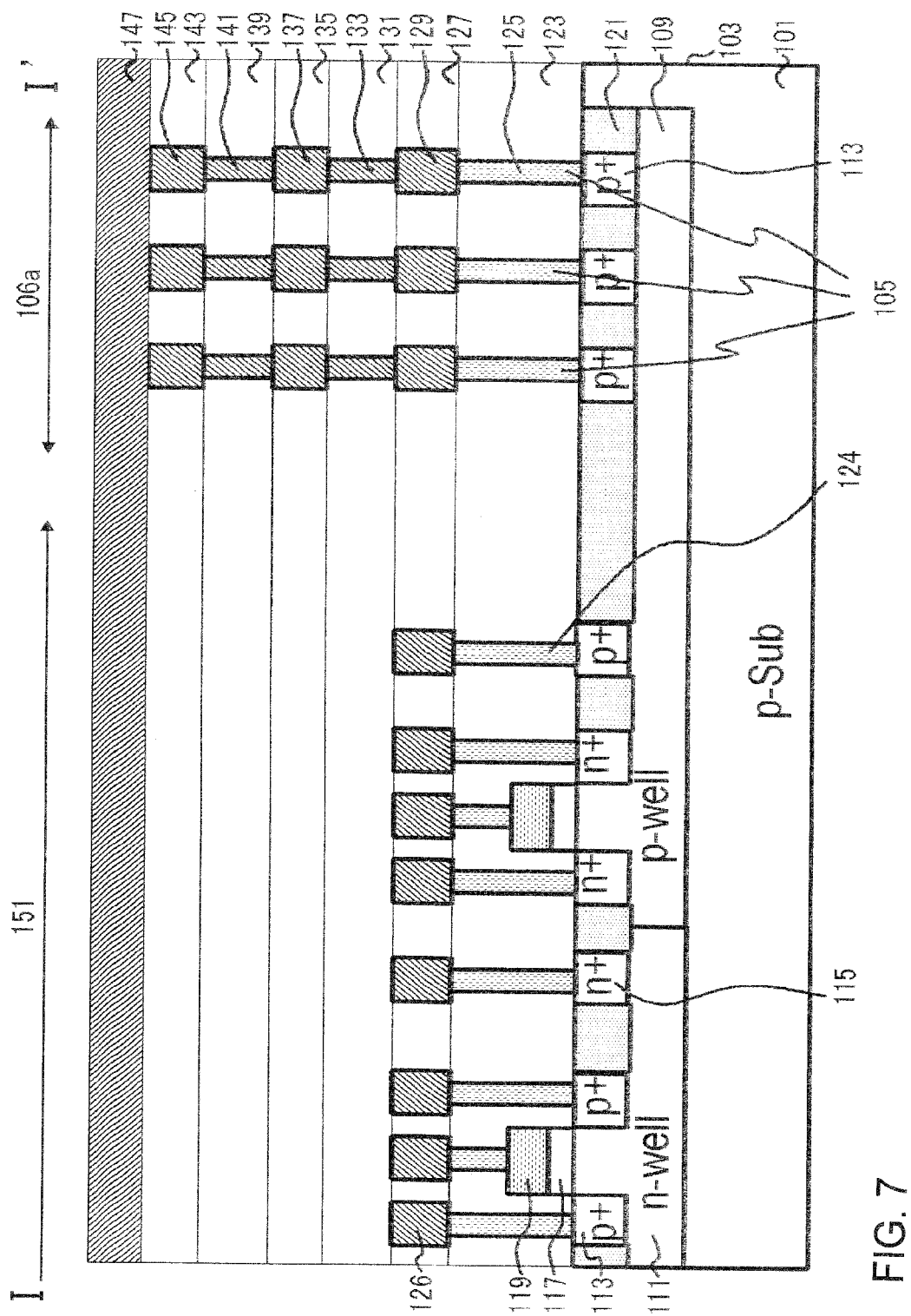
FIG. 7 is a cross-sectional view taken on line I-I' of FIG. 6.

FIG. 7 is a cross-sectional view taken on line I-I' of FIG. 6. FIG. 7 shows a cross-sectional configuration of the first region 106a. In FIG. 7, a p-well 109 is formed in the vicinity of the upper surface of a silicon substrate 101 from a logic unit 151 to a seal ring region 106. A $p^+$-diffusion layer 113 is formed in contact with the surface of the p-well 109. The lateral peripheries in the $p^+$-diffusion layers 113 are separated from each other by a device-separating film 121. The bottom of the first conductive ring 125 is in contact with the surface of the silicon substrate 101 having the $p^+$-diffusion layer 113.

In the semiconductor chip shown in FIG. 7, a II-II' cross section has the configuration described with reference to FIG. 3 in Embodiment 1. The seal ring region 106 in FIG. 3 corresponds to the second region 106b in this embodiment.

Again, referring to FIG. 6, the second region 106b may be, for example, formed in a region adjacent to the analog unit 153. Furthermore, it may be preferably formed, in addition to the region adjacent to the analog unit 153, in a region separated by a predetermined distance, for example, a minimum margin between the logic unit 151 and the analog unit 153 in the substrate plane.

More specifically, assuming that a minimum distance between the ends of the logic unit 151 and of the analog unit 153 in the substrate plane is L, the second region 106b extends to a position distant from the region adjacent to the analog unit 153 and the end of the analog unit 153 by about the length L. Thus, transmission of a noise generated in the logic unit 151 to the analog unit 153 via the seal ring 105 can be more reliably prevented.

In the configuration of this embodiment, the seal ring region 106 is the second region 106b comprising a nonconducting part 104 in the region adjacent to the analog unit 153 and its neighborhood. Thus, noise transmission via the seal ring 105 can be prevented as in Embodiment 1.

In this embodiment, between the first conductive ring 125 and the silicon substrate 101, the second region 106b includes two junction planes acting as a nonconducting part 104 in which a conductivity type is inverted, between the $p^+$-diffusion layer 113 and the n-well 111 and between the n-well 111 and the silicon substrate 101 (p substrate). Thus, two nonconducting parts 104 formed by two pn junctions are arranged in series in the path from the logic unit 151, through the seal ring 105 to the analog unit 153. Therefore, in comparison with a configuration where one part inverting a conductivity is formed in the path as described later in Embodiments 5 and 6, transmission of a low-frequency noise to the analog unit 153 can be further reliably prevented.

Embodiment 5

The configuration described in Embodiment 2 (FIG. 4) may be applied for the second region 106b formed in the region adjacent to the analog unit 153 and its neighborhood in Embodiment 4.

Again, in this configuration, the seal ring region 106 includes a nonconducting part 104 in the region adjacent to the analog unit 153 and its neighborhood. Thus, there is one nonconducting part 104 formed by a pn junction in the path from the logic unit 151, through the seal ring 105 to the analog unit 153. Thus, as described in Embodiment 4, noise transmission via the seal ring 105 can be prevented.

Comparing the configuration of this embodiment with that in Embodiment 6, there is $n^+$-diffusion layer 115 near the surface of the silicon substrate 101 immediately under the first conductive ring 125 in Embodiment 6, while there are not only the $n^+$-diffusion layer 115 but also the n-well 111 in this embodiment. A junction capacity may be, therefore, smaller in this embodiment than Embodiment 6. That is, in this configuration, an impedance can be significantly increased by forming an nonconducting part 104. Thus, noise transmission can be further reliably prevented.

Embodiment 6

The configuration described in Embodiment 3 (FIG. 5) may be applied for the second region 106b formed in the region adjacent to the analog unit 153 and its neighborhood in Embodiment 4.

Again, in this configuration, the seal ring region 106 includes a nonconducting part 104 in the region adjacent to the analog unit 153 and its neighborhood. Thus, there is one nonconducting part 104 formed by a pn junction in the path from the logic unit 151, through the seal ring 105 to the analog unit 153. Thus, as described in Embodiments 4 and 5, noise transmission via the seal ring 105 can be prevented.

Embodiment 7

In the above embodiments, an impedance is increased by forming a pn junction acting as a nonconducting part 104 in the conduction path between the logic unit 151 and the analog unit 153 to make the path between the logic unit 151 and the analog unit 153 nonconductive. A nonconducting part 104 may have any configuration as long as it can block the conduction path from the logic unit 151 through the seal ring 105 to the analog unit 153, and specifically may have a configuration where the seal ring 105 has a defective part which is buried in an insulating film.

Figure 8:
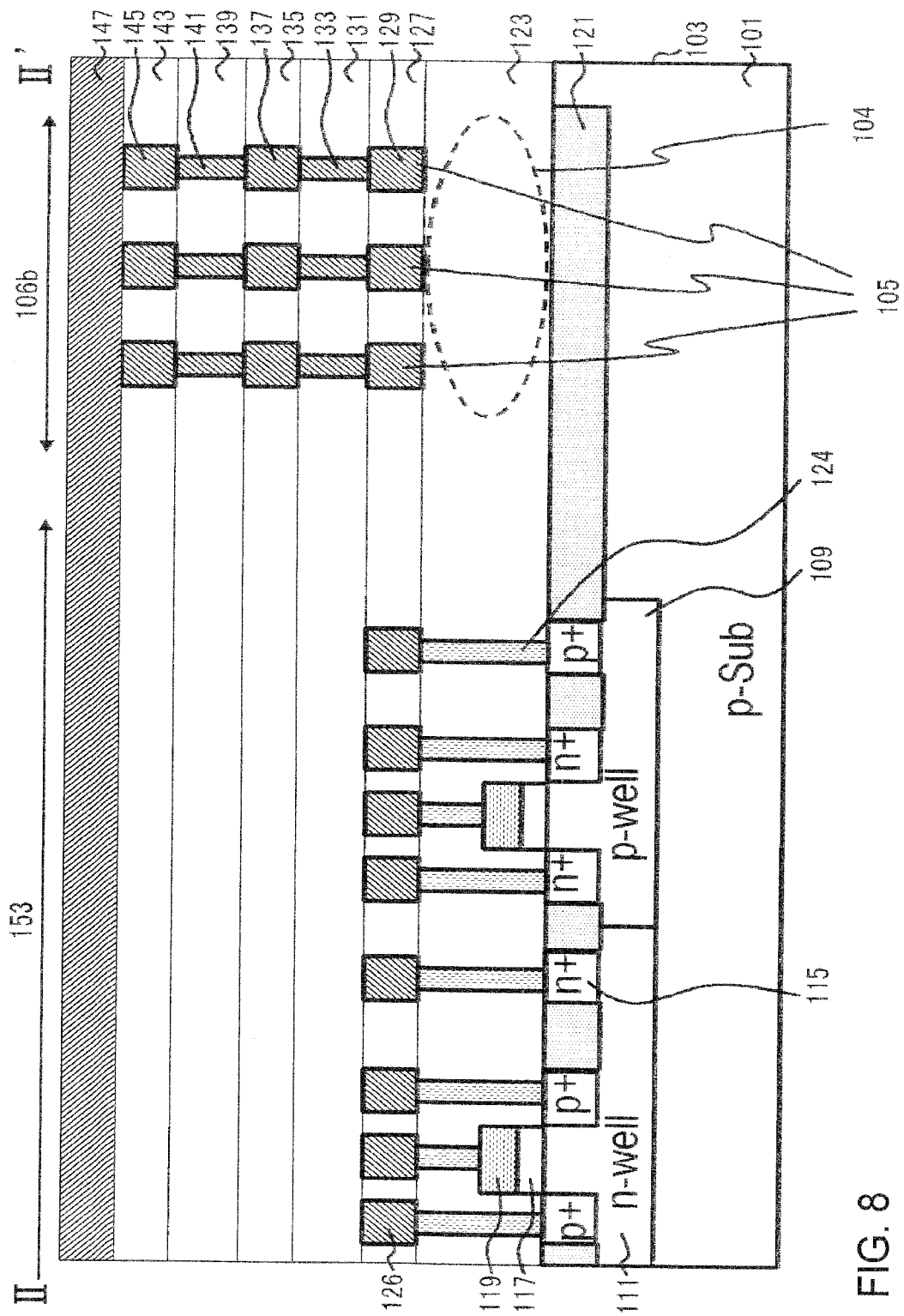
FIG. 8 is a cross-sectional view showing a semiconductor device according to an embodiment of this invention.

A semiconductor chip of this embodiment also has the planar shape shown in FIG. 6 as in Embodiments 4 to 6. Furthermore, the configuration of the I-I' cross section in FIG. 6 is as described above with reference to FIG. 7, while the configuration of the II-II' cross section is as shown in FIG. 8. FIG. 8 is a cross-sectional view showing the configuration of the semiconductor chip according to this embodiment.

As shown in FIG. 8, the second region 106b comprising a nonconducting part 104 is in the vicinity of the logic unit 151 or the analog unit 153 (in this embodiment, the analog unit 153).

In the second region 106b including the nonconducting part 104 in the seal ring region 106, the silicon substrate 101 and the seal ring 105 are separated by the first insulating film 123, and the first insulating film 123 constitutes the nonconducting part 104. Furthermore, in the region other than the second region 106b comprising the nonconducting part 104 (the first region 106a), the seal ring 105 is connected to the silicon substrate 101.

More specifically, a basic configuration of the second region 106b is as described for the first region 106a shown in FIG. 7, except that the p-well 109 is terminated within the analog unit 153 and the first conductive ring 125 is not formed in the second region 106*b*. In the second region 106*b*, the bottom of the seal ring 105 is the second conductive ring 129 adjacent to the first insulating film 123, and the first insulating film 123 which acts as a nonconducting part 104 intervenes between the seal ring 105 and the silicon substrate 101. The seal ring 105 and the silicon substrate 101 are insulated by the first insulating film 123.

Again, in this embodiment, the second region 106*b* may be formed in the region adjacent to the analog unit 153 as described in Embodiment 4. Furthermore, it may be preferably formed, in addition to the region adjacent to the analog unit 153, in a region separated by a predetermined distance, for example, a minimum margin between the logic unit 151 and the analog unit 153 in the substrate plane.

There will be described the effects of the semiconductor chip according to this embodiment (FIGS. 6 to 8).

The semiconductor chip of this embodiment includes a partially defective first conductive ring 125 in the layer of the first insulating film 123. Specifically, as shown in FIG. 8, a seal ring region 106 where a seal ring 105 is to be formed is defined by a second region 106*b* comprising a nonconducting part 104 in a region adjacent to the analog unit 153 and its neighborhood. In the second region 106*b*, the bottom of the seal ring 105 is in contact with the first insulating film 123, so that the seal ring 105 and the silicon substrate 101 is not connected via the first conductive ring 125, but are insulated, that is, nonconductive, by the first insulating film 123. Thus, the nonconducting part 104 can be a region with large R in equation (1) above, to increase an impedance Z. Therefore, this configuration can prevent a noise generated in the logic unit 151 from being transmitted, for example, by the path sequentially consisting of the silicon substrate 101, the seal ring 105 and the silicon substrate 101, to the analog unit 153. Thus, malfunction of a device in the analog unit 153 can be prevented.

The seal ring 105 is not in contact with the silicon substrate 101 only in the second region 106*b*, while in the first region 106*a*, the first conductive ring 125 is in contact with the surface of the p$^+$-diffusion layer 113 in the silicon substrate 101. Furthermore, a defective conductive ring is only the first conductive ring 125 in the second region 106*b* while the other conductive rings are annually formed over the whole periphery. Therefore, a function as a seal ring is suitably ensured over the whole periphery of the dicing plane 103 in the semiconductor chip 100.

Although a technical field is different, Japanese Laid-Open Patent Publication No. 2002-270608 has described a semiconductor integrated circuit device including a conductor fence constituting a wetproof ring. The semiconductor integrated circuit device includes an insulating film buried in a silicon substrate. The conductor fence is connected to the insulating film via a conductor region such as polycrystalline silicon over the whole periphery.

After investigation, the present inventor has found that deterioration in a component such as breakage of a Cu film constituting a conductor fence or an insulating film may occur in a manufacturing process for the above configuration. It seems to be because for a configuration where a conductor fence is connected to an insulating film over the whole periphery, a charge cannot escape from the conductor fence so that a charge tends to be stored in the conductor fence, for example, during plasma irradiation in a manufacturing process and thus such a stored charge tends to cause deterioration in a component.

In contrast, in the region adjacent to the analog unit 153 and its neighborhood in the semiconductor chip of this embodiment (FIGS. 6 to 8), the seal ring region 106 is the first region 106*a*. In the first region 106*a*, the first conductive ring 125 is connected to a region having the same conductivity type as the silicon substrate 101, specifically the surface of the silicon substrate 101 comprising the p$^+$-diffusion layer 113. Therefore, even when a plasma is used in a process for forming the seal ring 105, charge storage within the seal ring 105 can be prevented to effectively discharge a charge to the silicon substrate 101. Thus, in this configuration, noise transmission from the logic unit 151 to the analog unit 153 can be prevented and production stability can be further improved. Therefore, in this semiconductor chip 100, deterioration in a component due to a manufacturing process can be reliably prevented.

Embodiment 8

In the above embodiments, there has been described the semiconductor chip where the seal ring 105 is a closed endless ring in the region adjacent to the analog unit 153 and its neighborhood, and a region acting as a nonconducting part 104 blocking conduction between the seal ring 105 and the silicon substrate 101 extends in a substrate in-plane direction. However, the seal ring 105 may be a partially defective circle, and the configuration may include, as a nonconducting part 104, an insulating interlayer which cuts the seal ring 105 in the normal line of the silicon substrate 101.

Specifically, in the second region 106*b*, the seal ring 105 includes a plurality of columnar conductors buried in the first insulating film 123 to the sixth insulating film 143 which are mutually separated, and the plurality of columnar conductors are arranged as a diagonal lattice in the plane. The first insulating film 123 to sixth insulating film 143 separating the plurality of columnar conductors are regions with a large R value in equation (1) above, which act as a nonconducting part 104.

Alternatively, the configuration of this embodiment may be combined with any of those in Embodiments 1 to 7 described above, to more reliably prevent noise transmission.

Figure 9:
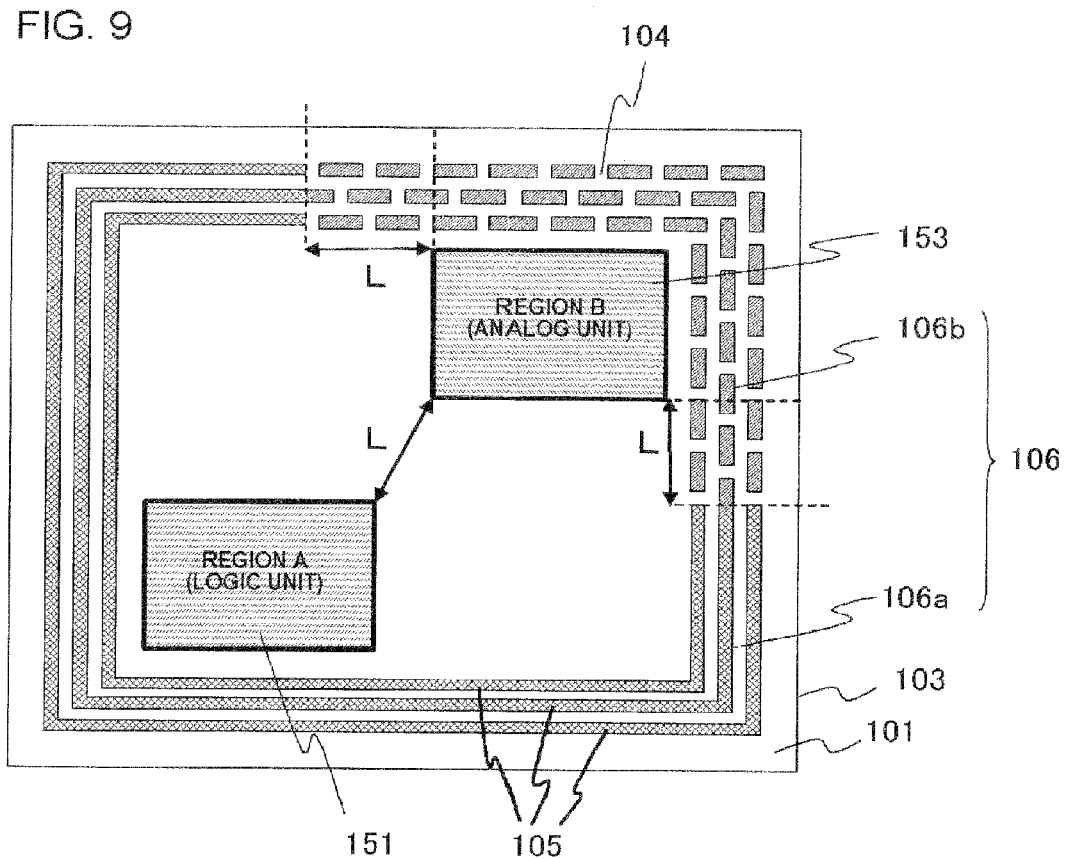
FIG. 9 is a plan view showing a semiconductor device according to an embodiment of this invention.

FIG. 9 is a plan view showing a configuration of such a semiconductor chip. In the semiconductor chip shown in FIG. 9, the seal ring 105 is cut from the top to the bottom in the second region 106*b*. In the second region 106*b*, striped annular conductors having the cross-sectional shape shown in FIGS. 3 to 6 are arranged as a diagonal lattice, specifically, a staggered (hound's-tooth) lattice.

Although there have been described some embodiments of this invention with reference to the drawings, these are illustrative only, and various configurations other than those described above can be employed.

For example, although the above embodiments have been described for the configuration where the seal ring 105 is a triple-annular conductor, there are no restrictions to the number of annular conductors in the seal ring 105, and the number can be appropriately selected. By employing a configuration where the seal ring 105 includes a plurality of, particularly three or more annular conductors, its essential function as a seal ring 105 can be further effectively exhibited even when a nonconducting part 104 is formed.

Although the above embodiments have been described for the configuration where inside of the dicing plane 103, there is formed the seal ring 105 along the dicing plane 103, the seal ring 105 is not necessarily formed along the dicing plane 103, as described later with reference to FIG. 10.

Although the above embodiments have been described for the configuration where the seal ring 105 surrounds the periphery of the logic unit 151 and the analog unit 153, any of the configurations of the above embodiments may be employed for a semiconductor chip comprising a guard ring surrounding at least one of the logic unit 151 and the analog unit 153.

Figure 10:
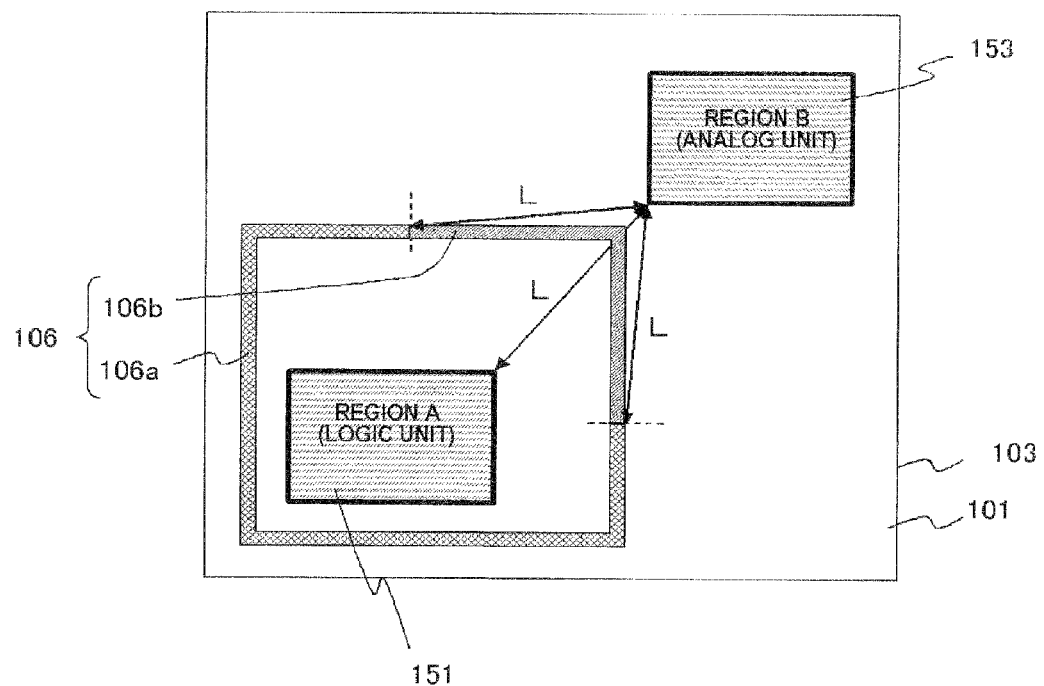
FIG. 10 is a plan view showing a semiconductor device according to an embodiment of this invention.
Figure 11:
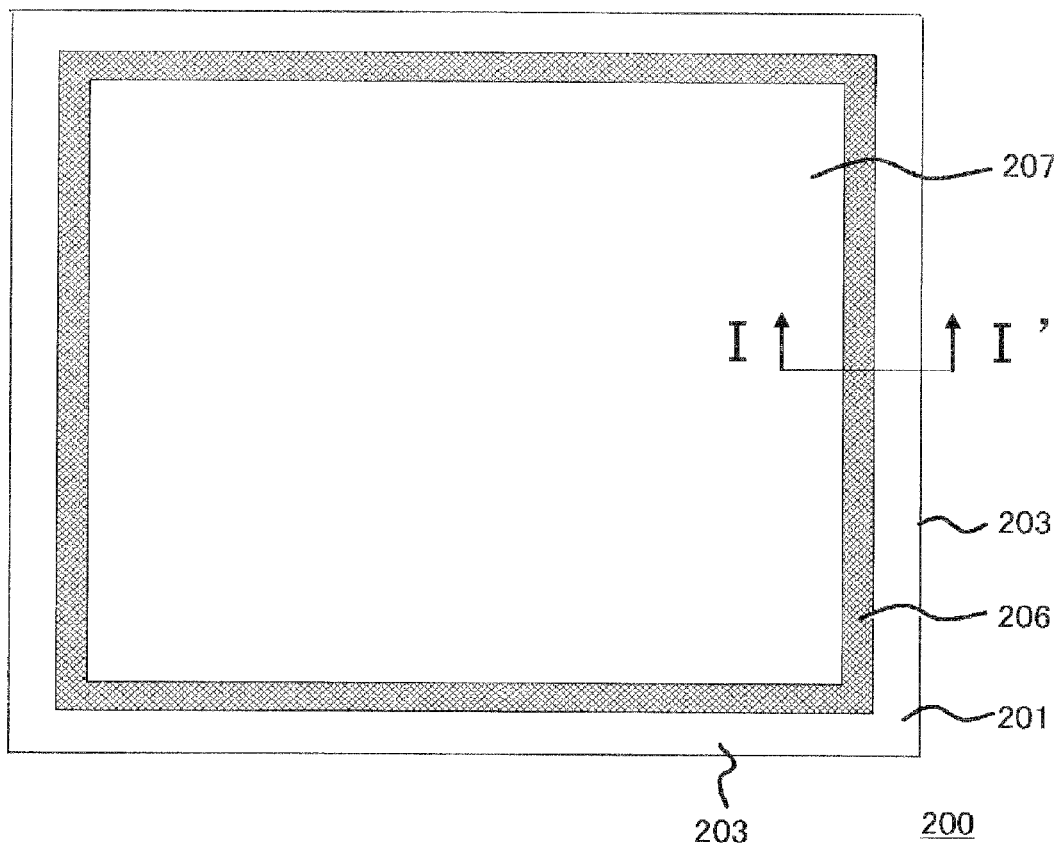
FIG. 11 is a plan view showing a semiconductor device.
Figure 12:
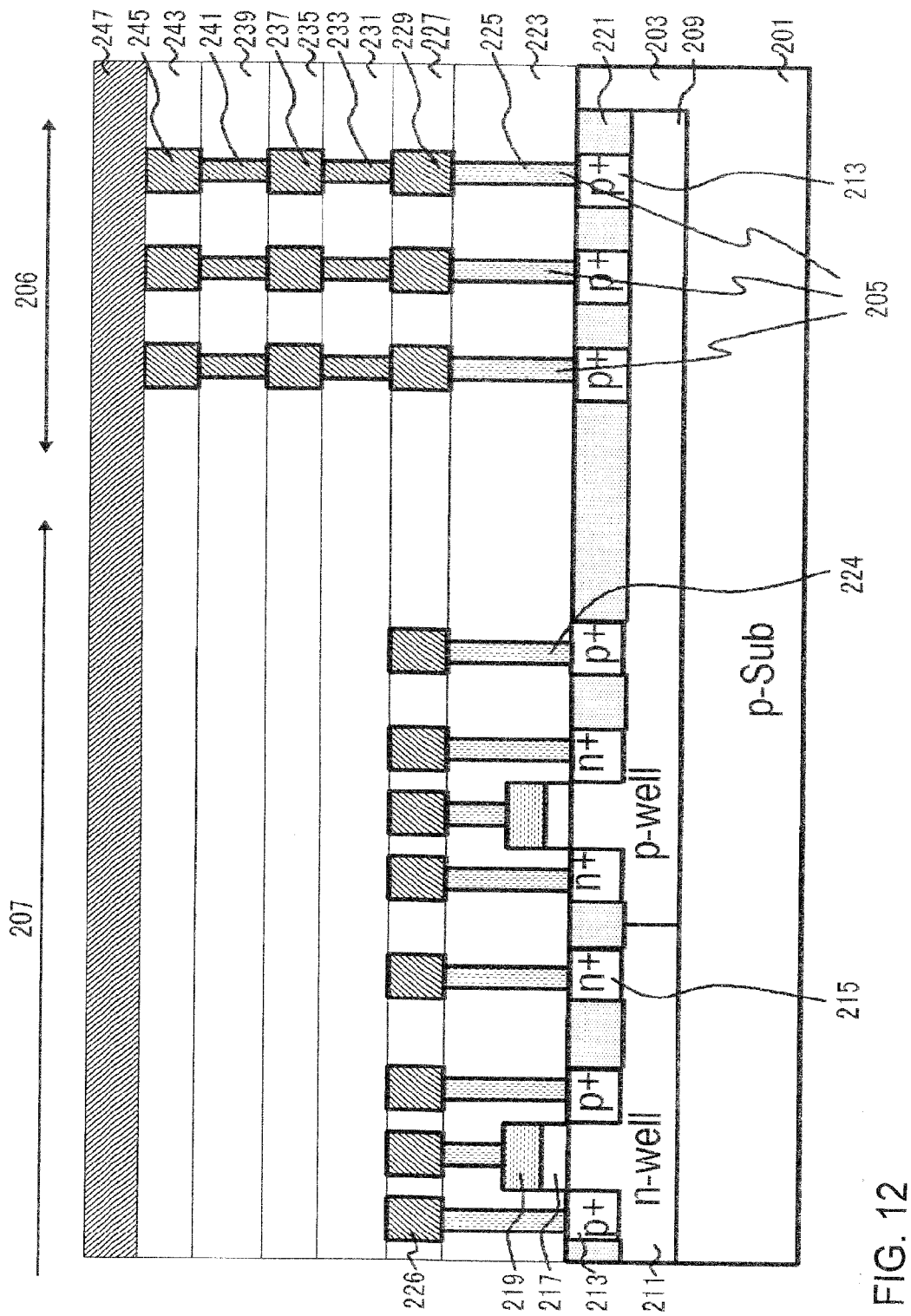
FIG. 12 is a cross-sectional view taken on line I-I' of FIG. 11.
Figure 13:
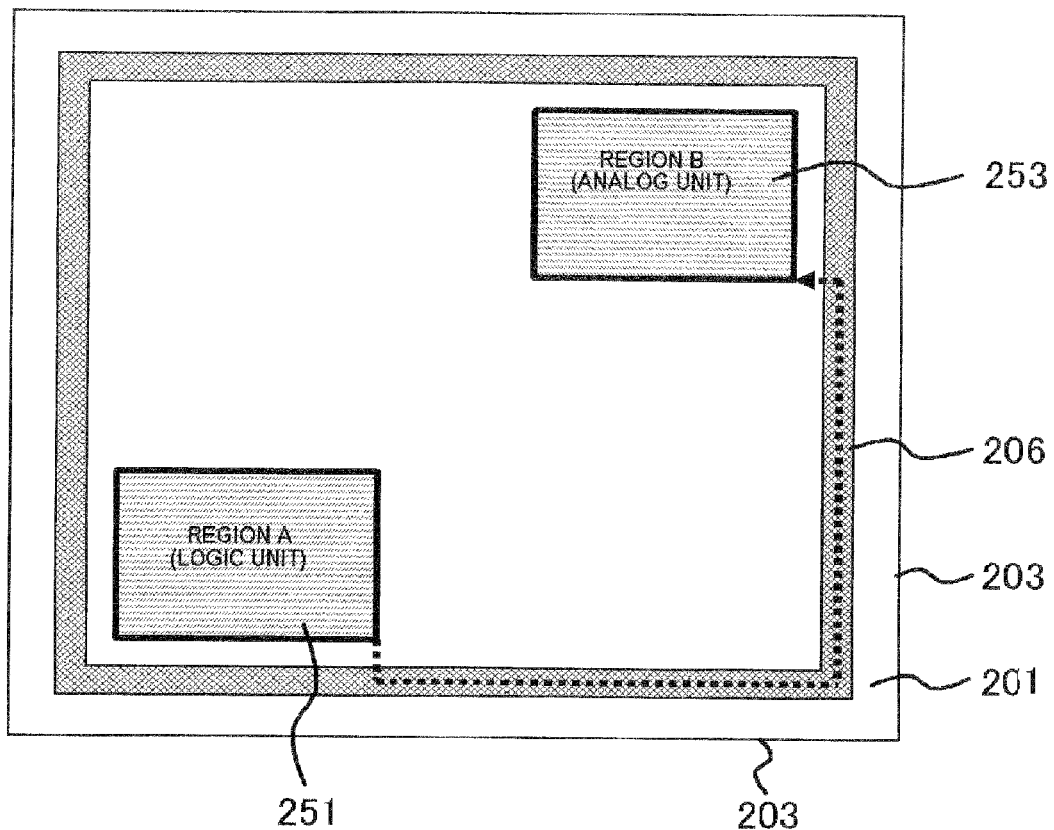
FIG. 13 is a plan view showing a semiconductor device.

Specifically, a configuration shown in FIG. 10 may be employed, where there is formed an annular guard ring surrounding the periphery of the logic unit 151 and the analog unit 153 is disposed outside of the guard ring. Furthermore, any of the configurations described in the above embodiments may be applied to the region where the guard ring to be formed, as a seal ring 106. Again, in such a configuration, at least a nonconducting part 104 can be formed in the region adjacent to the analog unit 153 and its neighborhood, to prevent a noise from being transmitted from the logic unit 151, through the seal ring 105 to the analog unit 153.

Although the above embodiments have been described for the configuration where the logic unit 151 and the analog unit 153 include a complementary field-effect transistor, a configuration of the logic unit 151 or the analog unit 153 is not limited to that. Furthermore, although the above embodiments have been described for the configuration where the logic unit 151 and the analog unit 153 are formed as a device region in the silicon substrate 101 and a guard ring surrounding at least the periphery of the logic unit 151 is formed, a device region is not limited to the logic unit 151 or the analog unit 153, and an alternative configuration may be employed, where there is at least one device region in which the problem of noise transmission may occur and at least one of the region and another device region is formed within the area surrounded by a guard ring.

It is apparent that the present invention is not limited to the above embodiment, that may be modified and changed without departing from the scope and spirit of the invention.

What is claimed is:

1. A semiconductor device comprising:
    a semiconductor substrate comprising a first device region, a second device region and a guard ring region, the semiconductor substrate being a first conductivity type, and the guard ring region surrounding the first device region and the second device region;
    a first semiconductor region formed in the guard ring region, said first semiconductor region being a second conductivity type which is opposite conductivity type to the first conductivity type;
    a first p-type transistor and first n-type transistor formed in the first device region and a second p-type transistor and a second n-type transistor formed in the second device region;
    an insulating interlayer formed over the semiconductor substrate;
    an annular guard ring surrounding both the first device region and the second device region and comprising a conductive film buried in the insulating interlayer and formed over the guard ring region, the annular guard ring being electrically connected to the first semiconductor region;
    a first well region formed in the first device region, the first well region being the first conductivity type; and
    a second well region formed in the second device region, the second well region being the first conductivity type,
    wherein a pn junction plane is formed between the first semiconductor region and the semiconductor substrate.

2. The semiconductor device as claimed in claim 1, further comprising:
    an insulating layer on the substrate; and
    wherein the annular guard ring is formed in the insulating layer in the guard ring region.

3. The semiconductor device as claimed in claim 1, wherein the first semiconductor region is formed under the annular guard ring.

4. The semiconductor device as claimed in claim 1, wherein the first device region includes nMOS and pMOS, and the second device region includes nMOS and pMOS.

5. The semiconductor device as claimed in claim 1, wherein the first device region is a logic unit and the second device region is an analog unit.

6. The semiconductor device as claimed in claim 1, wherein the first semiconductor region includes a third well region of the second conductivity type such that the pn junction plane is formed between the third well region and the semiconductor substrate such that the pn junction plane is formed between the third well region and the semiconductor substrate.

7. The semiconductor device as claimed in claim 1, further comprising:
    a device separating film formed both between the first well region and the guard ring region and between the second well region and the guard ring region,
    wherein the first semiconductor region comprises a first diffusion region such that the side periphery of the first diffusion region is surrounded by the device separating film.

8. The semiconductor device as claimed in claim 7, wherein the pn junction plane is formed between the first diffusion region and the semiconductor substrate.

9. The semiconductor device as claimed in claim 7, wherein the first semiconductor region includes a third well region of the second conductivity type, the first semiconductor region being formed under the first diffusion region such that the pn junction plane is formed between the third well region and the substrate.

10. The semiconductor device as claimed in claim 1, wherein the pn junction plane blocks an electric conduction in a path from the first device region to the second device region through the guard ring region.

* * * * *